United States Patent
Yu et al.

[11] Patent Number: 6,110,840
[45] Date of Patent: Aug. 29, 2000

[54] METHOD OF PASSIVATING THE SURFACE OF A SI SUBSTRATE

[75] Inventors: Zhiyi Jimmy Yu, Gilbert; Corey D. Overgaard, Phoenix; Ravi Droopad; Jonathan K. Abrokwah, both of Tempe; Jerald A. Hallmark, Gilbert, all of Ariz.

[73] Assignee: Motorola, Inc., Schaumburg, Ill.

[21] Appl. No.: 09/024,148

[22] Filed: Feb. 17, 1998

[51] Int. Cl.[7] .................................................. H01L 21/31
[52] U.S. Cl. ........................................ 438/758; 117/108
[58] Field of Search ................................. 438/758, 738, 438/743, 238; 117/108, 109, 92; 427/255; 505/473

[56] References Cited

U.S. PATENT DOCUMENTS

| | | | |
|---|---|---|---|
| 5,225,031 | 7/1993 | Mckee et al. | 156/612 |
| 5,482,003 | 1/1996 | McKee et al. | 117/108 |
| 5,648,321 | 7/1997 | Bednorz et al. | 505/473 |
| 5,690,737 | 11/1997 | Santiago et al. | 117/92 |
| 5,783,495 | 7/1998 | Li et al. | 438/738 |

*Primary Examiner*—Matthew Smith
*Assistant Examiner*—Calvin Lee
*Attorney, Agent, or Firm*—Eugene A. Parsons; William E. Koch

[57] ABSTRACT

A method of passivating the surface of a Si wafer is disclosed including the steps of cleaning the surface of the Si wafer and depositing an alkaline earth metal on the clean surface at a wafer temperature in a range of approximately 400° C. to 750° C. The surface is monitored during deposition to detect a (4×2) surface reconstruction pattern indicating approximately a one-quarter monolayer of alkaline earth metal is formed. The wafer is annealed at a temperature in a range of 800° C. to 900° C. until the alkaline earth metal forms an alkaline earth metal silicide with a (2×1) surface pattern on the surface.

25 Claims, 1 Drawing Sheet

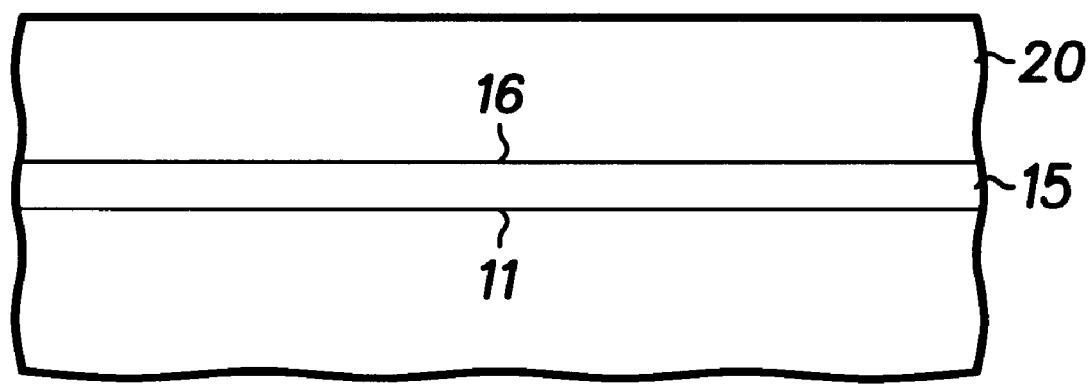

6,110,840

METHOD OF PASSIVATING THE SURFACE OF A SI SUBSTRATE

FIELD OF THE INVENTION

The present invention pertains to methods of passivating the surface of a silicon substrate in preparation for further fabrication processes.

BACKGROUND OF THE INVENTION

A passivated and stable silicon (Si) surface is most desirable for subsequent epitaxial growth of single crystal ferroelectrics or high dielectric constant oxides on silicon for non-volatile and high density memory device applications. It is pivotal to establish a passivated yet ordered Si surface, especially for subsequent growth of single crystal oxides, e.g. perovskites. The only reported successful growth of these oxides, such as BaO and BaTaO$_3$ on Si(100) was based on a BaSi$_2$ (cubic) template by depositing one fourth monolayer of Ba on Si(100) using reactive epitaxy at temperatures greater than 850° C. See for example: R. McKee, et al., *Appl. Phys. Lett.* 59(7), pp, 782–784, (Aug. 12, 1991); R. McKee, et al., *Appl. Phys. Lett.* 63(20), pp, 2818–2820, (Nov. 15, 1993); R. McKee et al., *Mat. Res. Soc. Symp. Proc.*, Vol. 21, pp. 131–135, (1991); U.S. Pat. No. 5,225,01, issued Jul. 6, 1993, entitled "Process for Depositing an Oxide Epitaxially onto a Silicon Substrate and Structures Prepared with the Process"; and U.S. Pat. No. 5,482,003, issued Jan. 9, 1996, entitled "Process for Depositing Epitaxial Alkaline Earth Oxide onto a Substrate and Structures Prepared with the Process". The high temperature requirement for the Molecular Beam Epitaxy surface preparation and template (e.g. BaSi$_2$) formation truly makes the above mentioned process a high temperature process. The major problems are that this high temperature process requires a much higher thermal budget, promotes diffusion in the structure, and often is not desirable or affordable.

It is highly desirable, therefore, to have a Molecular Beam Epitaxy compatible low temperature process that also provides an ordered wafer surface.

It is a purpose of the present invention to provide a new and improved method of passivating the surface of a Si substrate.

It is another purpose of the present invention to provide a new and improved method of passivating the surface of a Si substrate using Molecular Beam Epitaxy compatible low temperatures.

It is still another purpose of the present invention to provide a new and improved method of passivating the surface of a Si substrate which provides an ordered wafer surface.

SUMMARY OF THE INVENTION

The above problems and others are at least partially solved and the above purposes and others are realized in a method of passivating the surface of a Si substrate including the steps of providing a Si substrate with a clean surface, depositing an alkaline earth metal on the clean surface at a substrate temperature in a range of approximately 400° C. to 750° C. until approximately a one-quarter monolayer of alkaline earth metal is formed, and annealing the substrate at a temperature in a range of 800° C. to 900° C. until the alkaline earth metal forms an alkaline earth metal silicide with a (2×1) surface reconstruction pattern on the surface.

BRIEF DESCRIPTION OF THE DRAWING

Referring to the drawing, the single FIGURE is a simplified sectional view of a silicon wafer in accordance with the present invention.

DESCRIPTION OF THE PREFERRED EMBODIMENT

Turning to the single FIGURE, a silicon wafer 10 is provided having a Si(100) surface 11. While a wafer is described herein as the substrate upon which the present invention is performed, it will be understood by those skilled in the art that substrates not composed of entire wafers can be used if desired. Surface 11 is degreased and cleaned, followed by hydrogen termination for temporary passivation. Generally, the degreasing is accomplished using the conventional RCA cleaning technique well known in the industry. At least surface 11 of wafer 10 is then given a rinse with deionized (DI) water and blow dried. A laser-assisted (radiant) particle removal process is then utilized followed by a conventional UV ozone treatment for a period of 10 to 20 minutes to insure that surface 11 is clean.

These various cleaning techniques are well documented in the industry and can be used either as described or other techniques can be either used individually or in conjunction with the described cleaning techniques.

Once the surface is degreased and cleaned, surface 11 of wafer 10 is hydrogen terminated, for example, by dipping wafer 10 into diluted HF solution. For example, a 5% HF solution can be utilized and wafer 10 can be dipped for 5 to 10 minutes. The hydrogen termination provides a temporary passivation to maintain surface 11 clean for the following process.

Wafer 10 is then loaded into a Molecular Beam Epitaxy (MBE) preparation chamber and preheated to a temperature in a range of 200° C. to 300° C. Preheated wafer 10 is then transferred into a Molecular Beam Epitaxy growth chamber and preheated to a temperature in a range of 550° C. to 750° C. to remove the hydrogen terminated surface 11. Simultaneously, surface 11 is monitored using Reflection High Energy Electron Diffraction techniques (RHEED) which are well documented in the art and which can be used in situ, i.e. while performing the preheating step within the growth chamber. In addition to removing the hydrogen, the preheating step, in conjunction with the degreasing and cleaning, achieves a (2×1) restructuring of Si(100) surface 11, which restructuring is monitored and sensed by the Reflection High Energy Electron Diffraction techniques. Thus, surface 11 is a clean, flat and ordered Si(100) surface with a (2×1) reconstruction.

The clean (2×1) restructured Si (100) surface 11 is then exposed to a molecular beam of alkaline earth metal at a substrate temperature in a range of approximately 400° C. to 750° C. in the Molecular Beam Epitaxy growth chamber while continuing to monitor surface 11 using Reflection High Energy Electron Diffraction techniques. While several alkaline earth metals may be used, the preferred metals are barium and/or strontium with preferred substrate temperatures being in a range of 550° C. to 650° C.

In a specific example, wafer 10 is heated to approximately 600° C. and one-quarter monolayer of barium is deposited while monitoring reconstruction changes using Reflection High Energy Electron Diffraction techniques. A monolayer of barium equals 6.78×10$^{14}$ atoms/cm$^2$. In this example, one-quarter monolayer of barium was deposited after approximately 3.75 minutes exposure to a barium cell at 550° C. The surface reconstruction RHEED patterns have at least two phase transitions at the relatively lower substrate temperatures of 400° C. to 750° C. The first phase transition occurs as reconstruction changes from (2×1) to (3×2) at one-sixth monolayer of barium coverage and the second phase transition occurs as reconstruction changes from (3×2)

to (4×2) at one-quarter monolayer of barium coverage. The (4×2) surface reconstruction pattern can be used as an indicator that one-quarter monolayer of barium coverage has been achieved. Thus, the exposing or barium deposition step is terminated when the (4×2) surface reconstruction pattern is sensed using Reflection High Energy Electron Diffraction techniques.

While continuing to monitor surface reconstruction changes, wafer 10 is annealed at a temperature in a range of 800° C. to 900° C. for a time in a range of 1–4 minutes. The annealing is performed in situ and basically consists of raising the substrate temperature while monitoring the surface reconstruction until a clear (2×1) RHEED surface pattern is obtained, at which time the annealing step is terminated. Generally, this occurs in the time it takes to raise the substrate to the indicated range, after which it is allowed to cool. Scanning Tunneling Spectroscopy (STS) measurements demonstrate that the resulting (2×1) ordered surface has a typical surface bandgap of 1.8 to 2.0 eV, or 3 times the surface bandgap of a bare (2×1) Si surface, indicating a fully passivated surface.

Referring to the FIGURE, a passivating template including an alkaline earth metal silicide layer 15 having a passivated surface 16 is illustrated. The ordered cubic and passivated surface 16 serves as a desirable template for subsequent oxide growth. Further, once formed and cooled passivated surface 16 will support the deposition of additional alkaline earth metal 20, such as barium and/or strontium, that does not react with silicide layer 15 for subsequent epitaxial growth of single crystal ferroelectric or high dielectric constant oxides on silicon in nonvolatile and high density memory device applications.

Thus, a Molecular Beam Epitaxy compatible low temperature process has been disclosed that passivates the surface of a Si substrate with an alkaline earth metal silicide while providing an ordered wafer surface. Further, the new and improved method of passivating the surface of a Si substrate uses Molecular Beam Epitaxy compatible low temperatures well below the high temperatures (>850° C.) required for the entire deposition procedure in prior art methods. The passivated and ordered wafer surface then supports additional alkaline earth metal for subsequent epitaxial growth of single crystal ferroelectric or high dielectric constant oxides on silicon in non-volatile and high density memory device applications.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of passivating the surface of a Si substrate comprising the steps of:

providing a Si substrate with a clean surface;
   depositing an alkaline earth metal on the clean surface at a substrate temperature in a range of approximately 400° C. to 750° C. until a (4×2) surface pattern is obtained; and
   annealing the substrate at a temperature in a range of 800° C. to 900° C. until the alkaline earth metal forms an alkaline earth metal silicide with a (2×1) surface pattern on the surface.

2. A method of passivating the surface of a Si substrate as claimed in claim 1 wherein the step of providing the Si substrate with a clean surface includes providing a Si wafer with a surface, degreasing the surface, cleaning the surface, and hydrogen terminating the surface.

3. A method of passivating the surface of a Si substrate as claimed in claim 2 wherein the step of cleaning includes washing with deionized water and blowing dry.

4. A method of passivating the surface of a Si substrate as claimed in claim 3 wherein the step of cleaning includes laser assisted particle removal.

5. A method of passivating the surface of a Si substrate as claimed in claim 4 wherein the step of cleaning includes treating with a UV-ozone cleaning procedure.

6. A method of passivating the surface of a Si substrate as claimed in claim 5 wherein the step of treating with the UV-ozone cleaning includes treating for a time in a range of 10–20 minutes.

7. A method of passivating the surface of a Si substrate as claimed in claim 5 wherein the step of cleaning includes dipping the surface in a diluted HF solution.

8. A method of passivating the surface of a Si substrate as claimed in claim 7 wherein the step of dipping includes using approximately a 5% HF solution for a time of approximately 5–10 minutes.

9. A method of passivating the surface of a Si substrate as claimed in claim 1 wherein the step of depositing the alkaline earth metal on the clean surface includes loading the substrate into a Molecular Beam Epitaxy preparation chamber and preheating the substrate to a temperature in a range of 200° C. to 300° C.

10. A method of passivating the surface of a Si substrate as claimed in claim 9 wherein the step of depositing the alkaline earth metal on the clean surface includes, subsequent to preheating, transferring the substrate to a Molecular Beam Epitaxy growth chamber and heating the substrate to a temperature in a range of 400° C. to 750° C. to remove hydrogen termination and to achieve a (2×1) restructured Si (100) surface.

11. A method of passivating the surface of a Si substrate as claimed in claim 10 wherein the step of depositing the alkaline earth metal on the clean surface includes, subsequent to heating in the Molecular Beam Epitaxy growth chamber, exposing the clean surface to a molecular beam of alkaline earth metal.

12. A method of passivating the surface of a Si substrate as claimed in claim 11 wherein the step of exposing the clean surface to the molecular beam of alkaline earth metal includes using one of barium, strontium, and combinations thereof as the alkaline earth metal.

13. A method of passivating the surface of a Si substrate as claimed in claim 1 wherein the step of depositing the alkaline earth metal on the clean surface includes monitoring surface reconstruction changes during the depositing step to determine the appearance of a (4×2) surface pattern.

14. A method of passivating the surface of a Si substrate as claimed in claim 13 wherein the step of monitoring includes observing a Reflection High Energy Electron Diffraction (RHEED) pattern.

15. A method of passivating the surface of a Si substrate as claimed in claim 13 wherein the step of annealing the substrate at a temperature in a range of 800° C. to 900° C. until the alkaline earth metal silicide forms the (2×1) surface pattern includes monitoring surface reconstruction changes during the annealing step.

16. A method of passivating the surface of a Si substrate comprising the steps of:

providing a Si substrate with a clean surface;
   exposing the clean surface to a molecular beam of alkaline earth metal at a substrate temperature in a range of approximately 400° C. to 750° C. until approximately a one-quarter monolayer of alkaline earth metal is formed;

annealing the substrate at a temperature in a range of 800° C. to 900° C. to form a (2×1) surface pattern of alkaline earth metal silicide on the surface of the Si substrate.

17. A method of passivating the surface of a Si substrate as claimed in claim 16 wherein the step of providing the Si substrate with a clean surface includes providing a Si wafer with a surface, degreasing the surface, cleaning the surface, and hydrogen terminating the surface, including dipping the surface in a diluted HF solution.

18. A method of passivating the surface of a Si substrate as claimed in claim 16 wherein the step of depositing the alkaline earth metal on the clean surface includes transferring the substrate to a Molecular Beam Epitaxy growth chamber and heating the substrate to a temperature in a range of 400° C. to 750° C. to remove hydrogen termination and to achieve a (2×1) restructured Si (100) surface.

19. A method of passivating the surface of a Si substrate as claimed in claim 16 wherein the step of exposing the clean surface to the molecular beam of alkaline earth metal includes using one of barium, strontium, and combinations thereof as the alkaline earth metal.

20. A method of passivating the surface of a Si substrate as claimed in claim 16 wherein the step of exposing the clean surface to the molecular beam of alkaline earth metal includes monitoring surface reconstruction changes during the exposing step and terminating the exposing step at the appearance of a (4×2) surface pattern indicating approximately a one-quarter monolayer of alkaline earth metal is formed.

21. A method of passivating the surface of a Si substrate as claimed in claim 20 wherein the step of monitoring includes observing a Reflection High Energy Electron Diffraction (RHEED) pattern.

22. A method of passivating the surface of a Si substrate as claimed in claim 16 wherein the step of annealing the substrate includes monitoring surface reconstruction changes during the annealing step and terminating the annealing when a (2×1) surface pattern is achieved.

23. A method of passivating the surface of a Si substrate comprising the steps of:

providing a Si substrate with a clean, hydrogen terminated surface;

introducing the Si substrate into a Molecular Beam Epitaxy growth chamber and heating the wafer to a temperature in a range of 400° C. to 750° C. to remove hydrogen termination and to achieve a (2×1) restructured Si (100) surface;

in the Molecular Beam Epitaxy growth chamber, exposing the clean (2×1) restructured Si (100) surface to a molecular beam of alkaline earth metal at a substrate temperature in a range of approximately 400° C. to 750° C.;

monitoring the surface of the Si substrate during the exposing step until a (4×2) surface pattern is obtained;

terminating the exposing step when the (4×2) surface pattern is obtained indicating the deposition of approximately one-quarter monolayer of alkaline earth coverage on the surface;

annealing the substrate at a temperature in a range of 800° C. to 900° C. for a time in a range of 1–4 minutes to form a (2×1) surface pattern of alkaline earth metal silicide on the surface of the Si substrate; and monitoring surface reconstruction changes during the annealing step and terminating the annealing when the (2×1) surface pattern is achieved.

24. A method of passivating the surface of a Si substrate as claimed in claim 23 wherein the step of exposing the clean surface to the molecular beam of alkaline earth metal includes using one of barium, strontium, and combinations thereof as the alkaline earth metal.

25. A method of passivating the surface of a Si substrate as claimed in claim 23 wherein the steps of monitoring include observing a Reflection High Energy Electron Diffraction (RHEED) pattern.

* * * * *